(12) United States Patent
Hou et al.

(10) Patent No.: US 7,271,102 B2
(45) Date of Patent: Sep. 18, 2007

(54) METHOD OF ETCHING UNIFORM SILICON LAYER

(75) Inventors: Chien-Chou Hou, Chiai (TW); Ching-Te Huang, Tainan (TW); Li-Wei Hwang, Hsinchu (TW); Shih-Kun Chen, Lujou (TW)

(73) Assignee: AU Optronics Corporation (TW)

( * ) Notice: Subject to any disclaimer, the term of this patent is extended or adjusted under 35 U.S.C. 154(b) by 181 days.

(21) Appl. No.: 10/600,377

(22) Filed: Jun. 20, 2003

(65) Prior Publication Data
US 2004/0106286 A1      Jun. 3, 2004

(30) Foreign Application Priority Data
Nov. 28, 2002   (TW) .............................. 91134675 A

(51) Int. Cl.
*H01L 21/461* (2006.01)
*H01L 21/302* (2006.01)

(52) U.S. Cl. ...................... 438/706; 438/719

(58) Field of Classification Search ............... 438/719, 438/753
See application file for complete search history.

(56) References Cited

U.S. PATENT DOCUMENTS

| | | | | |
|---|---|---|---|---|
| 4,613,400 A | * | 9/1986 | Tam et al. .................... 216/46 |
| 4,735,824 A | * | 4/1988 | Yamabe et al. ................ 427/79 |
| 5,395,804 A | * | 3/1995 | Ueda .......................... 438/166 |
| 5,930,617 A | * | 7/1999 | Wu ............................. 438/233 |
| 5,977,589 A | * | 11/1999 | Schloesser et al. ......... 257/329 |
| 6,204,130 B1 | * | 3/2001 | Gardner et al. ............. 438/287 |
| 6,207,565 B1 | * | 3/2001 | Yeh et al. .................... 438/669 |
| 6,284,612 B1 | * | 9/2001 | Wu ............................. 438/305 |
| 6,540,509 B2 | * | 4/2003 | Asano et al. ................ 432/205 |
| 6,759,315 B1 | * | 7/2004 | Furukawa et al. .......... 438/585 |

FOREIGN PATENT DOCUMENTS

JP      02000106357 A    *  4/2000
TW           501234          1/2002

* cited by examiner

*Primary Examiner*—Duy-Vu N Deo
(74) *Attorney, Agent, or Firm*—Ladas & Parry, LLP

(57) ABSTRACT

A method of etching a silicon layer to avoid non-uniformity. First, a patterned silicon layer is provided. Next, an etching buffer layer is conformally formed on the surface and the top layer of the patterned silicon layer. Finally, the etching buffer layer and the patterned silicon layer are etched until the thickness of the patterned silicon layer is reduced. The conformal oxide layer provides etching resistance as an etching buffer layer, such that the etching rate is uniform on the whole subject matter, thereby, reducing the thickness of the patterned silicon layer uniformly after etching.

23 Claims, 4 Drawing Sheets

METHOD OF ETCHING UNIFORM SILICON LAYER

BACKGROUND OF THE INVENTION

1. Field of the Invention

The invention relates to etching a silicon layer, and more particularly to a method of etching a silicon layer to avoid non-uniformity.

2. Description of the Related Art

Silicon has been widely used in the semiconductor field, not only for semiconductors also for thin film transistor liquid crystal displays (TFT LCD).

Normally, semiconductors are fabricated by series process comprising cleaning, deposition, photolithography, etching. However, it is difficult to acquire a silicon layer with a uniform thickness after etching. Conventionally, after patterning the silicon layer, residue of $Si_xO_yCl_z$ remains from the reaction of the etching agent comprising hydrogen halide (HX), such as HF, HCl, and HBr, and the silicon layer, formed on the sidewalls of the patterned silicon layer 102a, as shown in FIG. 1A. The residue 106 of $Si_xO_yCl_z$ is so stable, such that residue serving as a hard mask can protect the silicon from etching after removing the photoresist layer 104, as shown in FIG. 1B. Thus, sidewalls of the patterned silicon layer 102a are thicker than the other parts of the patterned silicon layer 102a. It is thus difficult to reduce the patterned silicon layer 102a uniformly using etching agents comprising hydride halogen.

SUMMARY OF THE INVENTION

Accordingly, an object of the present invention is to provide a method of uniformly etching a silicon layer.

The present invention forms a conformal oxide layer on a patterned silicon layer as an etching buffer layer with high etching resistance, such that the etching rate is uniform on the whole subject matter (the etching buffer layer and the patterned silicon layer), uniform after etching.

To achieve these and other advantages, the invention provides a method of etching a silicon layer to avoid non-uniformity. First, a patterned silicon layer is provided. Next, an etching buffer layer is conformally formed on the surface and the top layer of the patterned silicon layer. Finally, the etching buffer layer and the patterned silicon layer are etched until the thickness of the patterned silicon layer is reduced.

The patterned silicon layer is provided by following steps. First, a silicon layer is provided. Next, a mask with patterns is formed on the silicon layer. A first etching is performed to pattern the silicon layer using the mask as a shield, to form a patterned silicon layer with the patterns. Finally, the mask is removed.

According to the present invention, the etching buffer layer is formed by introducing a gas containing oxygen to the patterned silicon layer. The gas comprises 90%~100% oxygen and 10~0% etching agent used in second etching. The gas introduction is performed at about 10~90° C.

The etching buffer layer comprising silicon oxide ($SiO_2$) is formed by oxidation.

An etching agent selected from the group comprising $Cl_2$, $SF_6$, or HBr is used during etching.

The thickness of the etching buffer layer is about 5~20 nm, and the thickness of the patterned silicon layer is about 120~250 nm.

DESCRIPTION OF THE DRAWINGS

For a better understanding of the present invention, reference is made to a detailed description to be read in conjunction with the accompanying drawings, in which.

DETAILED DESCRIPTION OF THE INVENTION

A preferred embodiment of the present invention is now described with reference to FIGS. 2A through 2F.

Figure 1A:
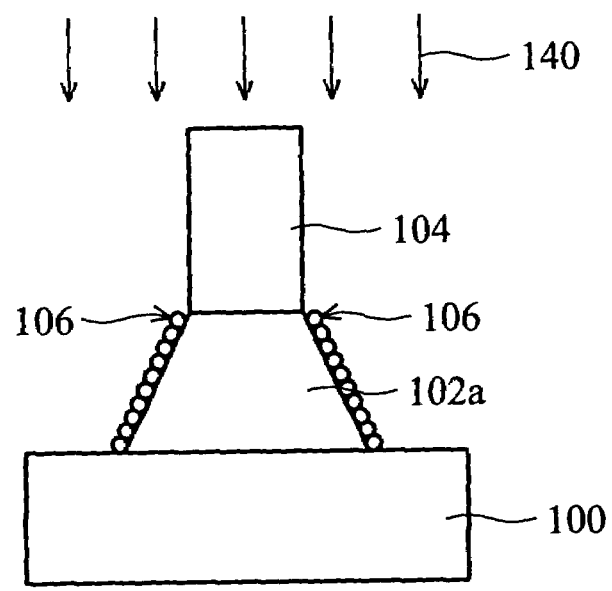
FIGS. 1A through 1B are cross-sections illustrating a non-uniform etched silicon layer.
Figure 1B:
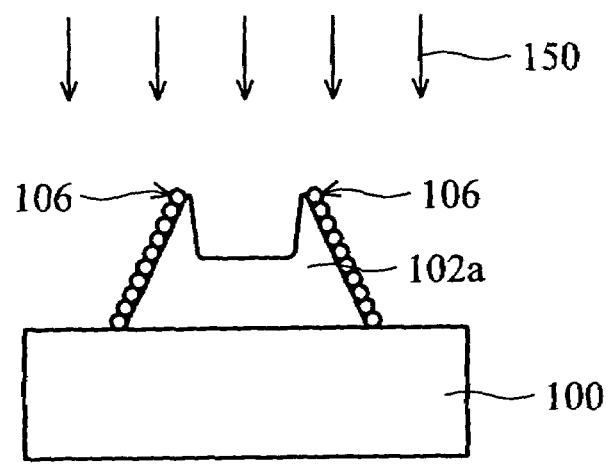
Figure 2A:
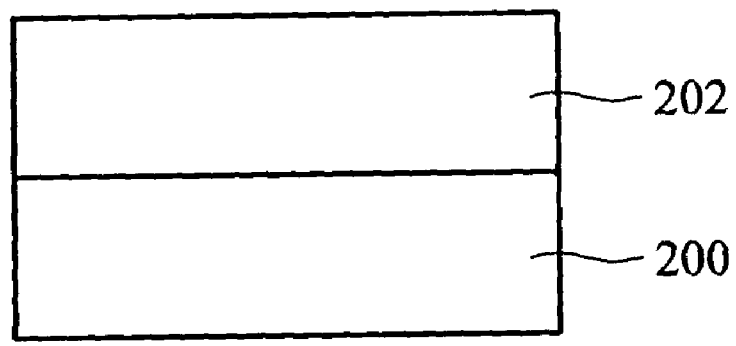
FIGS. 2A through 2F are cross-sections showing a method of uniformly etching a silicon layer according to a preferred embodiment of the present invention.

First, in FIG. 2A, a silicon layer 202 is deposited on a substrate 200, at a thickness of about 120~250 nm.

Figure 2B:
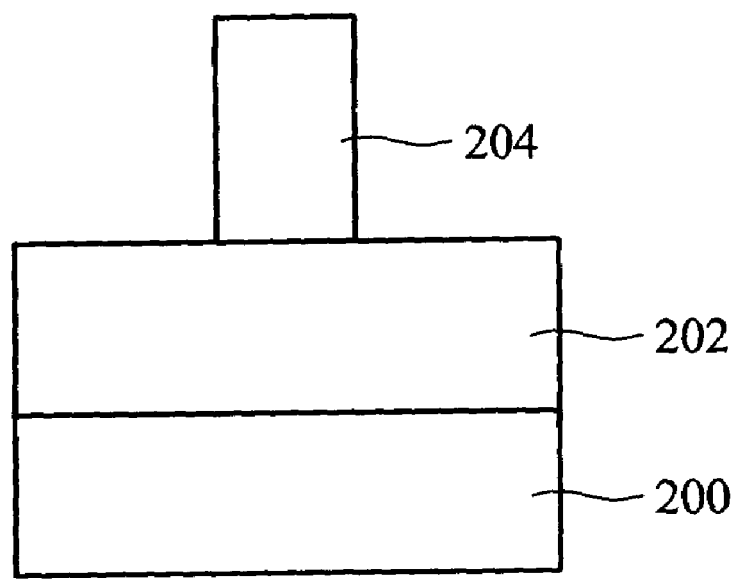

Next, in FIG. 2B, a mask 204 with patterns is formed on the silicon layer 202. The mask 204 can be a photoresist layer preferably formed by spin coating, after which a patterned photoresist layer 204 is obtained.

Figure 2C:
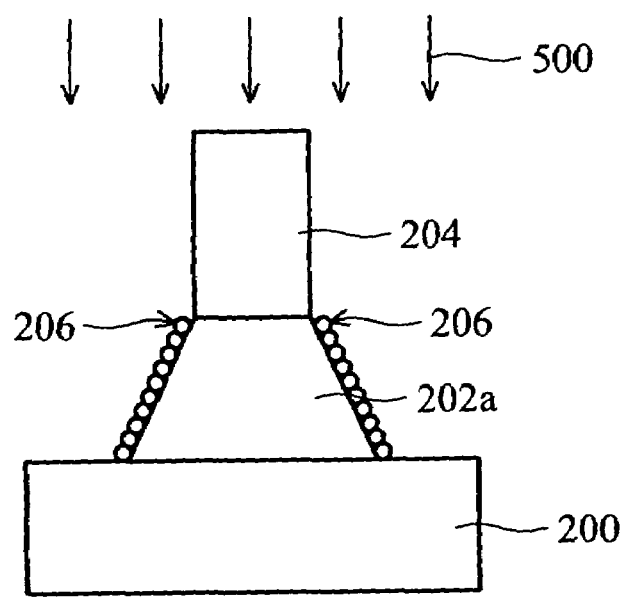

In FIG. 2C, a first etching 500 is performed to pattern the silicon layer 202 using the mask 204 as a shield, to form a patterned silicon layer 202a. The first etching is preferably performed to define the patterns of the silicon layer 202. The etching agent comprises HF, HCl, or HBr, such that residue of $Si_xO_yCl_z$ is formed as a block on the sidewalls of the patterned silicon layer 202a in subsequent etching.

Figure 2D:
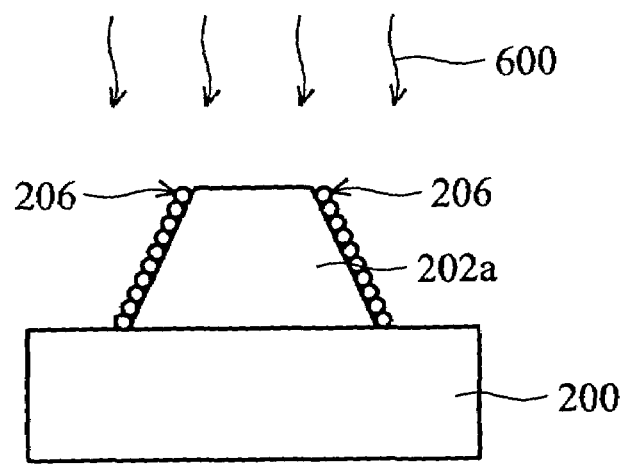
Figure 2E:
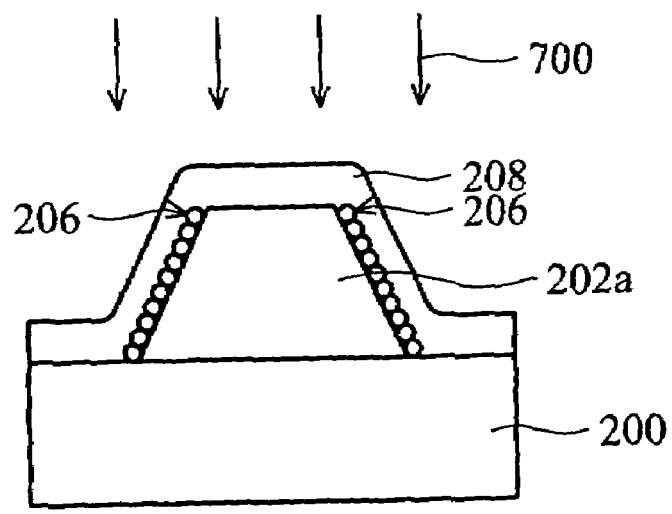

In FIG. 2D, a gas containing oxygen treatment 600 is introduced to the patterned silicon layer 202a inside an etching chamber at about 10~90° C. before performing a second etching. The gas comprises 90%~100% oxygen and 10~0% etching agent used in the second etching. Thus, an etching buffer layer 208 with high etching resistance is conformally formed on the surface and the top layer of the patterned silicon layer 202a, as shown in FIG. 2E. The material of the etching buffer layer 208 comprises silicon oxidation ($SiO_2$), and a thickness of about 5~20 nm.

Figure 2F:
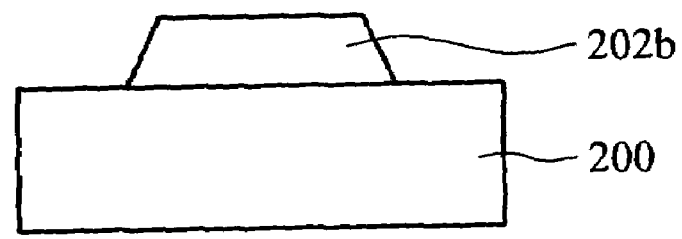

Finally, a second etching 700 is preferably performed to etch the etching buffer layer 208 and the patterned silicon layer 202a until the thickness thereof is reduced, as shown in FIG. 2F. The main purpose of second etching 700 is reduction and control of the thickness of the patterned silicon layer 202a. The second etching agent is from $Cl_2$, $SF_6$, or HBr. Because the conformable etching buffer layer 208 provides uniform high etching resistance, the etching rate is correspondingly uniform on the whole subject matter comprising the etching buffer layer and the patterned silicon layer. Thus, the thickness of the patterned silicon layer is reduced uniformly after the second etching.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of etching an uniform silicon layer, comprising:

providing a patterned silicon layer with etching residues on sidewalls thereof;

treating said patterned silicon layer with etching residues on sidewalls thereof using a gas comprising oxygen and a silicon etching agent to thereby form an etching buffer layer conformally on the etching residues and the top surface of the patterned silicon layer; and etching the etching buffer layer, the etching residues, and the patterned silicon layer until the thickness of the patterned silicon layer is reduced.

2. The method of claim 1, wherein the etching buffer layer comprises silicon oxide ($SiO_2$).

3. The method of claim 2, wherein the etching buffer layer is formed by oxidation.

4. The method of claim 1, further comprising $Cl_2$, $SF_6$, or HBr used during etching.

5. The method of claim 1, wherein the thickness of the etching buffer layer is about 5~20 nm.

6. The method of claim 1, wherein the thickness of the patterned silicon layer is about 120~250 nm.

7. A method of etching an uniform silicon layer, comprising:

providing a silicon layer;

forming a mask with patterns on the silicon Layer;

performing a first etching to pattern the silicon layer using the mask as a shield, to form a patterned silicon layer with patterns and etching residues on sidewalls thereof;

removing the mask;

treating said patterned silicon layer with patterns and etching residues on sidewalls thereof using a gas comprising oxygen and a silicon etching agent to thereby form an etching buffer layer conformally on the etching residues and the top surface of the patterned silicon layer; and performing a second etching to remove the etching buffer layer and the etching residues, to reduce the thickness of the patterned silicon layer.

8. The method of claim 7, wherein the mask is a photoresist layer.

9. The method of claim 7, wherein the etching buffer layer comprises silicon oxide ($SiO_2$).

10. The method of claim 9, wherein the etching buffer layer is formed by oxidation.

11. The method of claim 7, further comprising $Cl_2$, $SF_6$, or HBr used during the second etching.

12. The method of claim 7, wherein the thickness of the etching buffer layer is about 5~20 nm.

13. The method of claim 7, wherein the thickness of the patterned silicon layer is about 120~250 nm.

14. A method of etching a silicon layer to avoid non-uniformity, comprising:

providing a silicon layer;

forming a mask with patterns on the silicon layer;

performing a first etching to pattern the silicon layer using the mask as a shield, to form a patterned silicon layer with patterns and etching residues on sidewalls thereof;

removing the mask;

introducing a gas containing oxygen treatment, using a gas comprising oxygen and a silicon etching agent, to conformally form an etching buffer layer on the etching residues and the top surface of the patterned silicon layer; and performing a second etching to remove the etching buffer layer and the etching residues formed on sidewalls thereof, to reduce the thickness of the patterned silicon layer.

15. The method of claim 14, wherein the mask is a photoresist layer.

16. The method of claim 14, further comprising $Cl_2$, $SF_6$, or HBr used during the second etching.

17. The method of claim 14, wherein the thickness of the etching buffer layer is about 5~20 nm.

18. The method of claim 14, wherein the thickness of the patterned silicon layer is about 120~250 nm.

19. The method of claim 14, wherein the gas comprises 90%~100% oxygen and not more than 10% etching agent used in second etching.

20. The method of claim 14, wherein the gas containing oxygen treatment is performed at about 10~90° C.

21. The method of claim 1, wherein said silicon etching agent comprises $Cl_2$, $SF_6$, or HBr.

22. The method of claim 7, wherein said silicon etching agent comprises $Cl_2$, $SF_6$, or HBr.

23. The method of claim 14, wherein said silicon etching agent comprises $Cl_2$, $SF_6$, or HBr.

* * * * *